United States Patent

Shniper

[11] Patent Number: 5,896,000
[45] Date of Patent: Apr. 20, 1999

[54] MOUNTING FOR REDUCING VIBRATION-INDUCED SIDE BANDS

[75] Inventor: Samuel Shniper, Wilton, Conn.

[73] Assignee: Vectron Laboratories, Inc., Norwalk, Conn.

[21] Appl. No.: 08/598,984

[22] Filed: Feb. 9, 1996

[51] Int. Cl.[6] .................................................. H01L 41/08
[52] U.S. Cl. ............................................ 310/345; 310/324
[58] Field of Search ..................................... 310/345, 346, 310/351–353, 326, 348, 324

[56] References Cited

U.S. PATENT DOCUMENTS

| | | | |
|---|---|---|---|
| 1,907,986 | 5/1933 | Little | 310/353 |
| 2,688,059 | 8/1954 | Holzinger et al. | 200/91 |
| 3,046,423 | 7/1962 | Wolfskill et al. | 310/352 |
| 3,069,572 | 12/1962 | Dick et al. | 310/353 |
| 3,721,840 | 3/1973 | Yamada | 310/345 X |
| 3,937,991 | 2/1976 | Massa et al. | 310/326 |
| 4,404,459 | 9/1983 | Harton | 219/209 |
| 4,430,529 | 2/1984 | Nakagawa et al. | 310/324 X |
| 4,479,096 | 10/1984 | Fowks | 331/3 |
| 4,481,807 | 11/1984 | Van Basshuysen et al. | 310/324 X |
| 4,502,022 | 2/1985 | Stahl et al. | 310/353 |
| 4,603,316 | 7/1986 | Kobayashi et al. | 310/345 X |
| 4,705,981 | 11/1987 | Inove et al. | 310/324 |
| 4,899,076 | 2/1990 | Kato | 310/356 |
| 4,939,405 | 7/1990 | Okuyama et al. | 310/345 X |
| 4,969,197 | 11/1990 | Takaya | 310/345 X |
| 5,053,671 | 10/1991 | Kobayashi et al. | 310/345 X |
| 5,218,510 | 6/1993 | Bradford | 361/220 |
| 5,256,929 | 10/1993 | Terajima | 310/326 |

*Primary Examiner*—Mark O. Budd
*Attorney, Agent, or Firm*—St. Onge Steward Johnston & Reens LLC

[57] ABSTRACT

A vibration resistant mounting is described formed of a membrane on which an electronic device is mounted. The membrane is formed of a sheet material made of a suitable rubber such a solid silicone rubber and which is supported by a frame. The electronic device can be mounted to the membrane in various ways to provide vibration isolation that is a significant improvement over conventional mountings for small light weight electronic devices such as electronic oscillators.

18 Claims, 4 Drawing Sheets

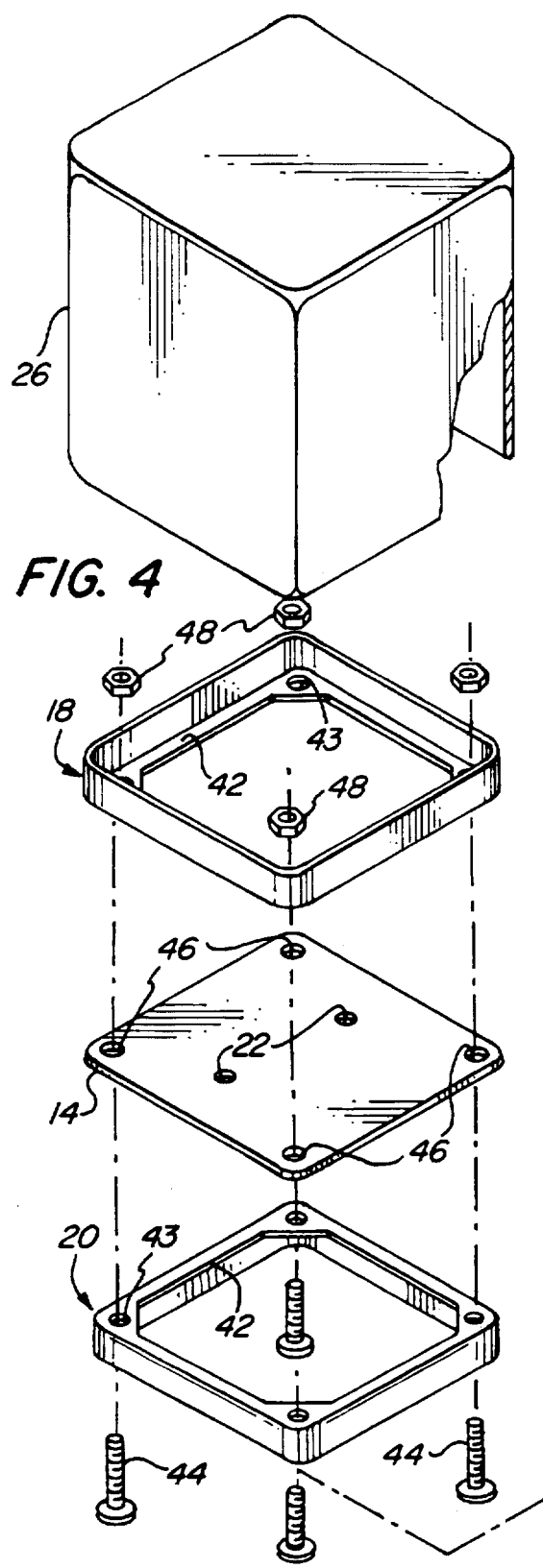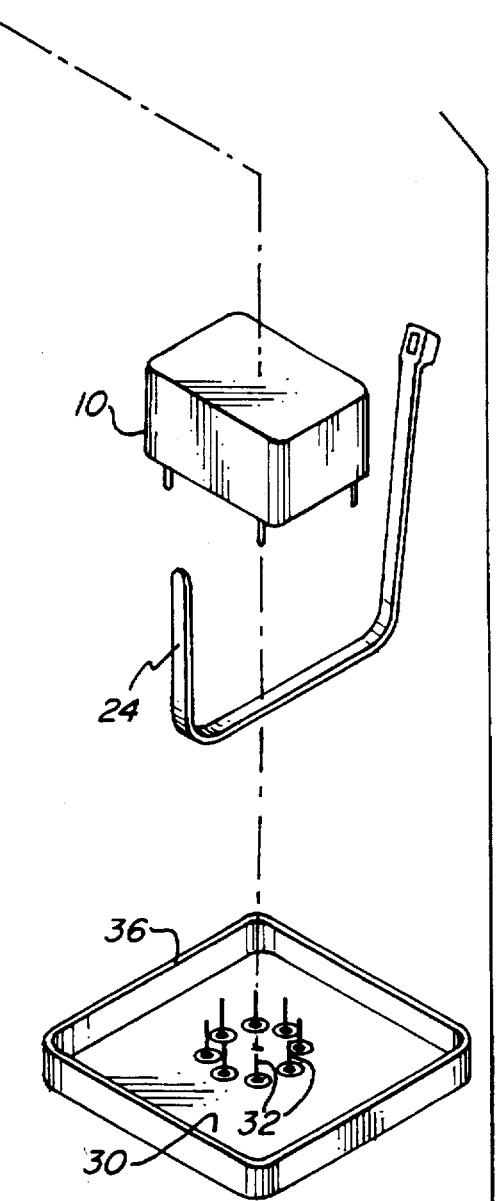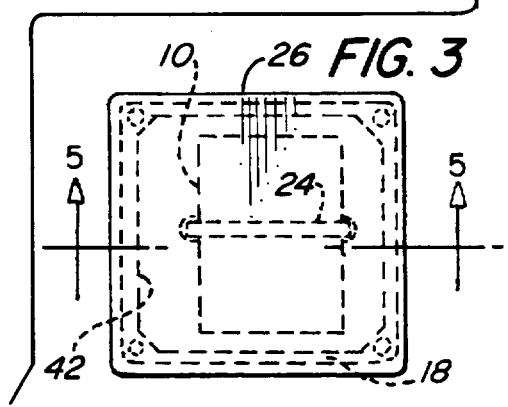

5,896,000

1

MOUNTING FOR REDUCING VIBRATION-INDUCED SIDE BANDS

FIELD OF THE INVENTION

This invention relates to a vibration resistant mounting and more specifically to a vibration resistant mounting for electronic devices such as oscillators and the like.

BACKGROUND OF THE INVENTION

Techniques for vibrationally isolating electronic devices have been extensively described. For example, in U.S. Pat. No. 1,907,986 (1933) to Little a piezo-electric crystal holding device is employed to prevent interference with frequency characteristics. The crystal is mounted inside a frame with a silk chord placed within a plane that has a particular relationship with orientations of the faces of the crystal and with the touch points of the chord selected to be at nodal points for minimum impact on the performance on the crystal. A spring loaded device is described in the U.S. Pat. No. 2,688,059 to Holzinger.

In the U.S. Pat. No. 3,046,423 to Wolfskill et al a vibration resistant mounting for a piezo-electric crystal is described. The mounting uses wire members, which are preferably resonant to the frequency of the crystal or some multiple or submultiple thereof. A spring type mounting for a wafer shaped piezo-electric device is described in the U.S. Pat. No. 3,069,572 to Dick et al. In U.S. Pat. No. 3,937,991 to Massa et al. a bilaminar crystal plate is supported within a frame structure by resilient pads attached to the nodal points of the crystal. An anti shock and vibration mounting is described in U.S. Pat. No. 4,404,459 to Harton.

A foam mounting for an oscillator is shown and described in U.S. Pat. No. 4,479,096 to Fowks. In U.S. Pat. No. 4,502,022 to Stahl vibration and shock resistance for an oscillator is obtained by suspending the oscillator from a wire. In U.S. Pat. No. 4,677,397 to Nakayama et al an oscillator element is mounted on a resonant leaf spring. In U.S. Pat. No. 4,899,076 a tubular piezo-electric element is elastically supported by a torsionally displacing support within a vacuum inside a casing. In U.S. Pat. No. 5,218,510 to Bradford an electrostatic sensitive package is suspended between opposing films, capable of discharging a static charge, and peripherally suspended between opposing parts of a package to protect against damage from electrostatic discharges and physical abuse.

Crystal oscillators are required to deliver a pure sine wave for optimum performance. In practice their performance is influenced by factors such as temperature and vibrations. Vibrations typically induce undesirable sidebands, called phase noise, and it is important to be able to reduce phase noise to very low levels for maximum effectiveness. For example, an oscillator mounted on a typical prior art vibration isolation mounting may exhibit a sensitivity to vibrations by producing side bands near the center frequency of the oscillator within 130 db or less of the peak oscillator signal. Conventional vibration resistant mountings typically exhibit sideband spikes because of resonances or other mounting characteristics and are also sensitive to high physical displacements at low vibrational frequencies.

SUMMARY OF THE INVENTION

With a vibration resistant mounting in accordance with the invention vibration induced noise in the output from an oscillator can be significantly reduced. Phase noise can be reduced to levels that are from twenty to thirty db and even

2 more below the performance provided by a conventional mounting throughout the vibration frequency spectrum of concern. This can be achieved by mounting the oscillator on a sheet membrane made of a resilient material such as rubber and peripherally supporting the membrane. The membrane can be made of a wide variety of resilient materials.

It is, therefore, an object of the invention to provide a vibration resistant mounting for an electronic device. It is a further object of the invention to provide an oscillator whose vibration induced noise can be reduced to very low levels.

These and other advantages and objects of the invention can be understood from the following detailed description of a preferred embodiment as shown in the drawings.

BRIEF DESCRIPTION OF THE DRAWINGS

FIG. 3 is a top plan view of the oscillator and housing mounting of this invention;

FIG. 4 is a perspective exploded view of the oscillator and housing mounting in accordance with invention;

DETAILED DESCRIPTION OF THE DRAWINGS

Figure 1:
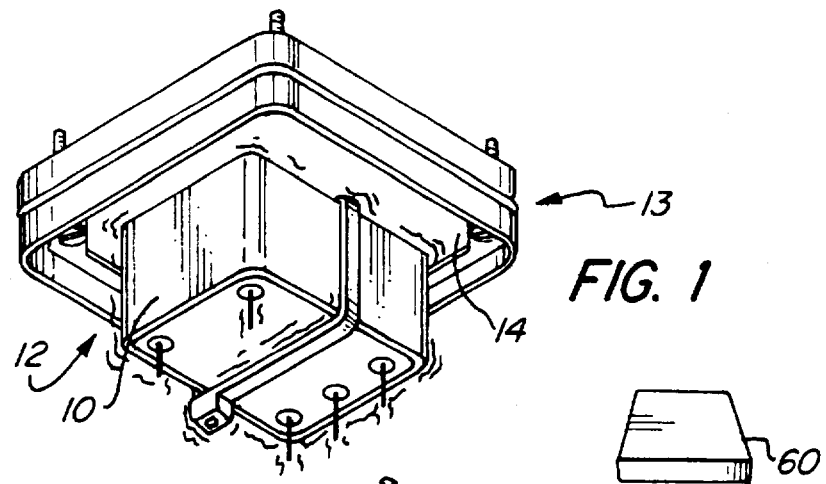
FIG. 1 is a perspective view of an oscillator and its mounting in accordance with the invention.

With reference to FIGS. 1 through 5 an electronic device 10 is shown affixed to a vibration resistant mounting 12 to form an electronic assembly 13. The device 10 in the drawings is an oscillator, though it is to be understood that other devices, which require a high level of isolation from vibration and shocks, can be placed on the mounting 12. The particular shape and design of the oscillator can be selected, for example, from a catalog for crystal oscillators published by the Vectron Laboratories, Inc. of Norwalk, Conn.

As described in this catalog, crystal oscillators typically employ piezo-electric crystals to provide a desired signal frequency. The signal output preferably is a pure sine wave but when subjected to vibrations produces side bands which may be measured as phase noise. The magnitude of the vibration induced sidebands or phase noise is a function of factors such as the level and frequency of the vibration, the crystal's acceleration sensitivity and the mechanical design of the oscillator.

With a mounting in accordance with the invention a mechanical design is provided with which sensitivities to external vibrations are substantially reduced. The mounting 12 includes a trampoline type membrane 14 peripherally clamped within a frame 16 formed by a pair of peripheral rectangular metal supports 18, 20. The frame 16 can be made in different ways such as a separate part as shown or as an integral part of a housing. The membrane 14 is pierced to form a pair of device mounting holes 22, which may be reinforced, and the oscillator 10 is attached to the membrane 14 by a conventional tie wrap 24 threaded through the holes 22. The entire oscillator assembly 13 is then affixed inside a metal cover 26 using conventional emplacement techniques such as soldering with a peripheral bead 28 located on the outer surface of one of the supports 18 and 20 to solder onto the inside of cover 26.

A lid 30 for cover 26 has a number of feed throughs 32 which are first connected by flexible light weight leads 33 to the signal leads 34 of the oscillator 10. The lid 30 is affixed to cover 26 using a conventional soldering technique involving a solder joint at 38 between the flange 36 of the lid 30 and the inner surface of the cover 26.

The supports 18, 20 are shaped to enable a peripheral clamping of the membrane 14 so that its resilient support of oscillator 10 acts in a trampoline fashion. Supports are rectangularly shaped to surround an aperture 40 with horizontal flanges 42. The flanges are enlarged at the corners to enable the formation of holes 43 through which bolts 44 can engage corner holes 46 in the membrane 14 to clamp its peripheral edge with the use of suitable nuts 48.

The rectangular shape for supports 18, 20 is not always needed. Different shapes can be employed such as circular or others depending on the desired shape of the membrane 14. The membrane 14 does not have to be continuously peripherally clamped as obtained with the frame shaped supports 18, 20. Sufficient peripheral support can be achieved with an adequate number of clamp points peripherally distributed around the membrane 14.

In one example for an oscillator mounting in accordance with the invention an oscillator 10 weighing about one ounce was affixed to a membrane 14 stretched approximately ⅛th of an inch around, having a thickness of 0.032 inches and which had exposed dimensions of 2 inches×2 inches and was made from solid silicone rubber having the following characteristics: a durometer rating (shore A, ASTM D-2240) of 30, a tensile strength of 1150 psi, ASTM D-412; an elongation of 800% per ASTM D-412; and a tear strength of 150 PPI, per ASTM D-624.

Figure 6:
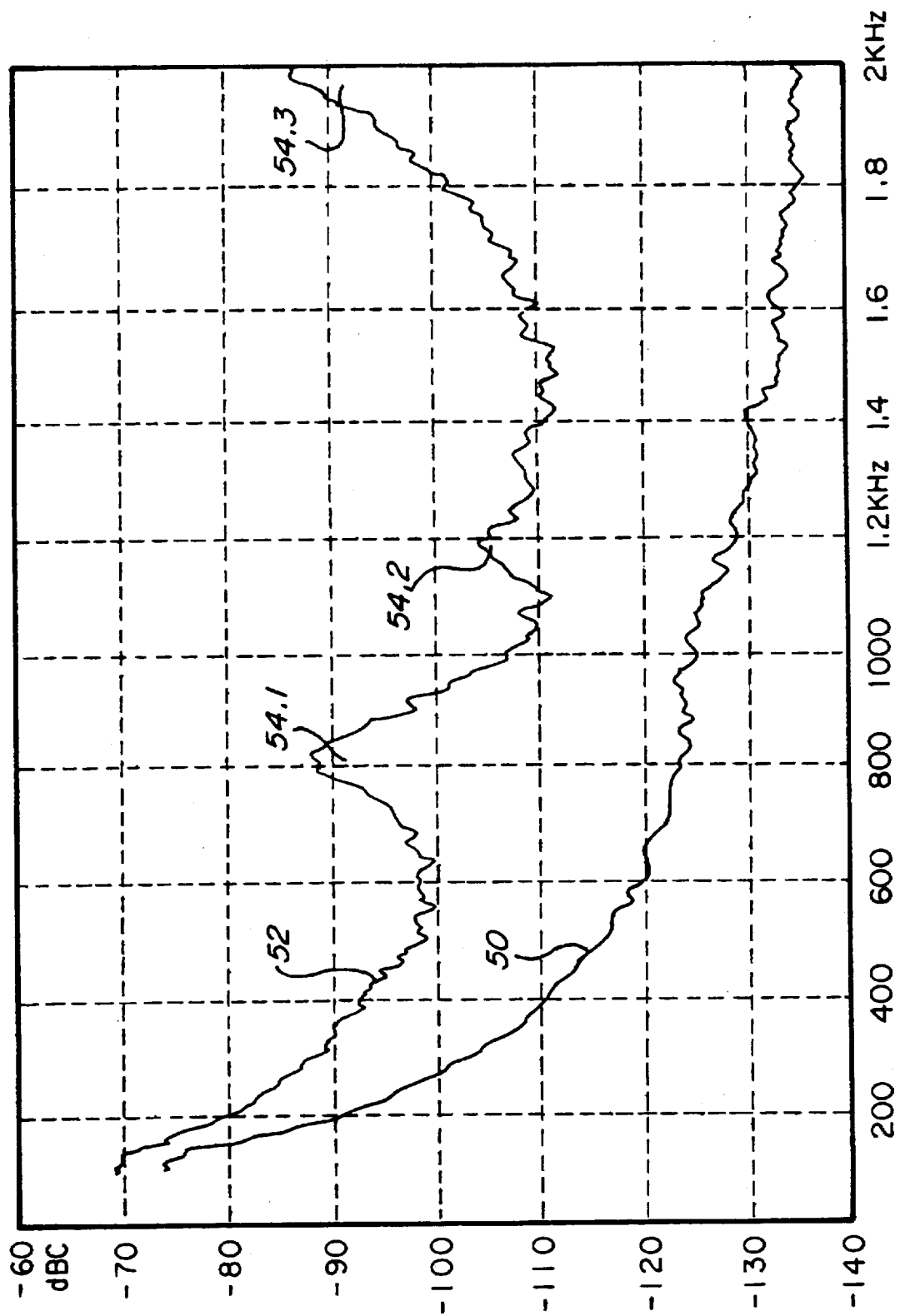
FIG. 6 is a plot of several curves for the normalized spectrum output from an oscillator when placed on a vibration resistant mounting in accordance with the invention and while the oscillator is subjected to vibration testing and for an unisolated mounting for an oscillator.

Such oscillator mounting 13 when vibration tested exhibited a performance characteristic as shown for the curve 50 in FIG. 6. FIG. 6 illustrates on the vertical scale the phase noise level in db below the carrier level (dBC) and the frequency of the phase noise normalized with respect to the frequency of the carrier from the oscillator. Curve 50 demonstrates vibration induced sidebands or phase noise being about 20 or more db below the level of the oscillator output for a conventional mounting without vibration isolation as illustrated with curve 52 in FIG. 6. Note that the performance curve 50 did not exhibit undesirable peaks throughout the vibration spectrum up to two KHz, whereas the curve 52 shows several of such undesirable peaks 54.1, 54.2 and one, 54.3, at the high frequency end.

Other materials than silicone rubber can be used for the membrane 14 such as natural rubber, synthetic rubbers such as neoprene and butyl rubber, provided these have the desired characteristics needed to provide the vibration isolation in accordance with the invention. Generally satisfactory membranes 14 can be made from rubbers having a durometer between about 20 to about 90; a tensile strength between about 500 and 2000 psi; an elongation capability between about 200% and 1200% and a tear strength between about 50 and 300 PPI.

Figure 2:
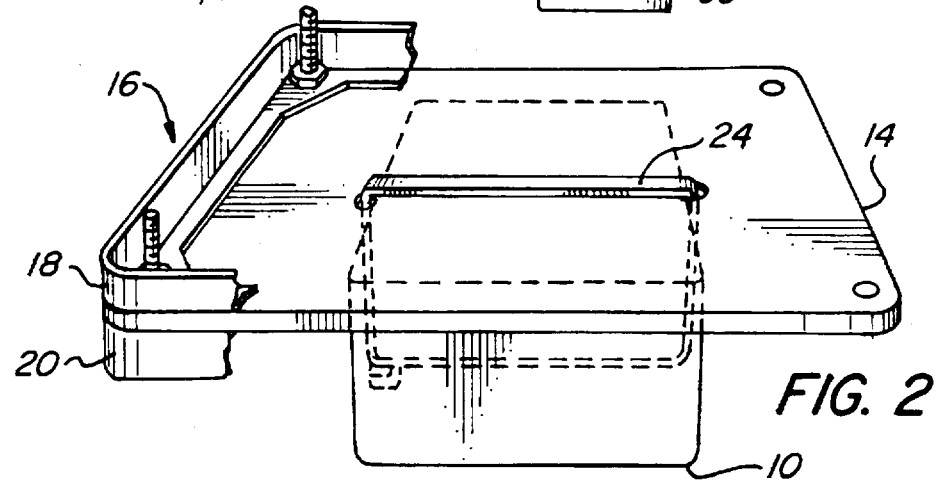
FIG. 2 is a perspective partially broken away view of the membrane used in the mounting of FIG. 1.
Figure 5:
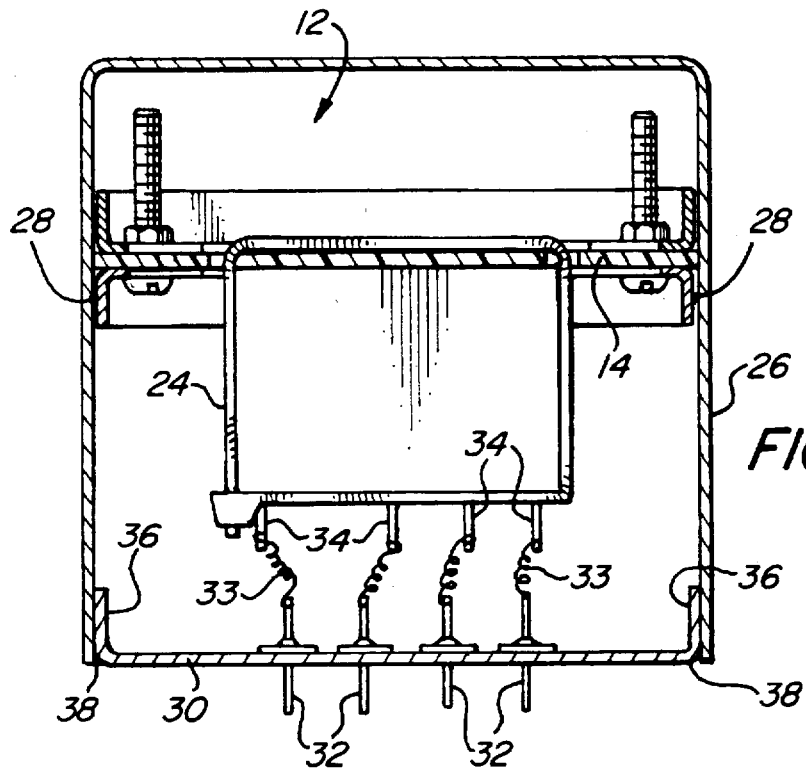
FIG. 5 is a section view of the housing mounting taken along the lines 5—5 in FIG. 3.

In some cases the electronic device that needs to be vibrationally isolated is very light, being a fraction of an ounce. In such case a mass 60 as shown in FIG. 2 is added to the membrane 14. The mass may be mounted underneath the strap 24 or be attached to the membrane 14 with such other suitable fastener as is appropriate. The mass typically is sufficiently large to assure that the composite vibration resistant mounting performs in accordance with curve 50 shown in FIG. 6. The mass for a very light weight electrical device 10 of the order of a fraction of an ounce, such as a tenth of an ounce, would be of the order of an ounce with a membrane of the type as described herein. The mass needed is also a function of the size of the membrane area.

Figure 7:
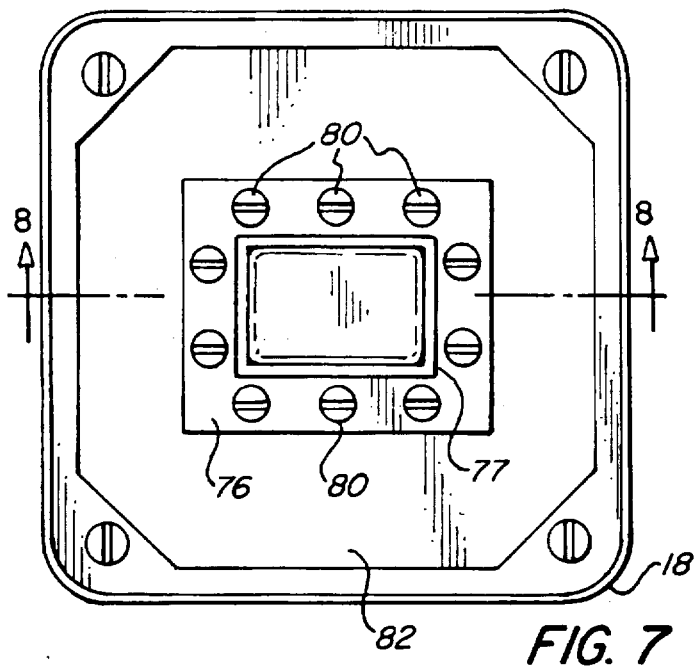
FIG. 7 is a plan vies of another vibration resistant mounting in accordance with the invention.
Figure 9:
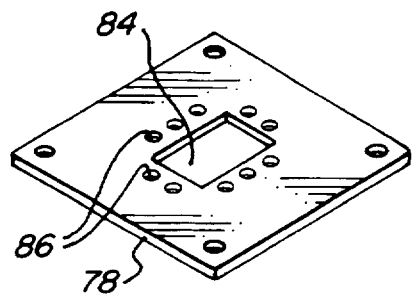
FIG. 9 is a perspective view of a membrane used in the assembly of FIG. 7.
Figure 8:
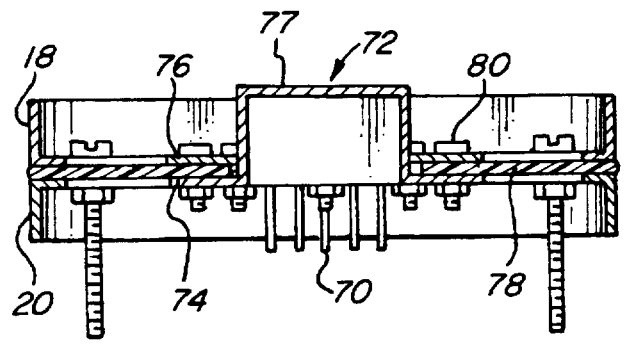
FIG. 8 is a section view of the vibration resistant mounting of FIG. 7 taken along the lines 8—8 in FIG. 7.

With reference to FIGS. 7 through 9 another embodiment of the invention is shown. An electronic device 70 is placed inside a housing 72 having a flange 74. A complementary shaped plate 76, which encircles the main part 77 of the housing 72, clamps a membrane 78 to the flange 74 with bolts 80. The remaining exposed portion 82 of the membrane then serves to provide the vibration isolation. This arrangement provides an improved attachment between the electrical device 70 and the trampoline type membrane 78.

The membrane 78 has a rectangular shaped central opening 84 shaped to accommodate the main part 77 of the housing 72. Holes 86 are penetrated by bolts 80 to clamp the membrane 78 between the flange 74 and plate 76. The peripheral mounting of the membrane 78 to supports 18, 20 is as described with reference to previous Figures.

Figure 10:
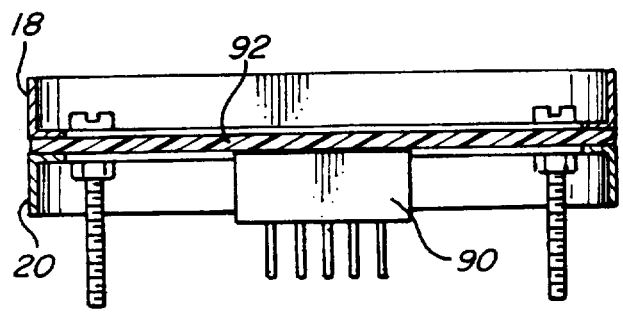
FIG. 10 is a section view of still another attachment used of an electrical device to a vibration resistant membrane in accordance with invention.
Figure 11:
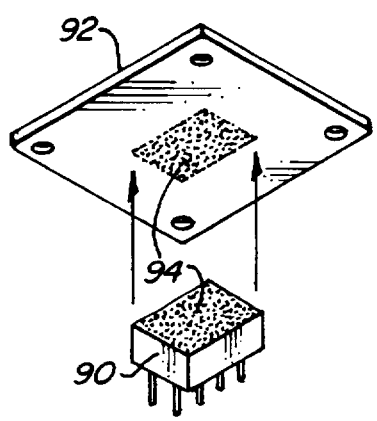
FIG. 11 is a perspective exploded view of another fastener used to attach an electronic device to a vibration resistant membrane in accordance with the invention.

FIGS. 10 and 11 show another mounting of an electrical device and housing 90 to a membrane 92 in accordance with the invention using an interlocking type fastener 94 having separable segments such as made of velcro attached to the housing of the device 90 and the membrane 92.

Having thus described a preferred embodiment in accordance with the invention its advantages can be appreciated. Variations from the embodiments can be contemplated by one skilled in the art without departing from the scope of the invention as set forth in the claims.

I claim:

1. A vibration resistant mounting with an electronic oscillator comprising:

a frame extending around an area;

an electronic oscillator;

a resilient flexible membrane sized to span the area and mounted to the frame so that the membrane is retained in a generally flat shape over the area, said membrane having a sufficiently resilient characteristic to enable the membrane to vibrationally isolate the electronic oscillator, which is mounted thereon; and conductors extending form the oscillator through the frame to provide a vibrationally stable oscillator signal.

2. A vibration resistant mounting for an electronic device comprising:

a frame extending around an area;

a resilient flexible membrane sized to span the area and mounted to the frame so that the membrane is retained in a generally flat shape over the area, said membrane having a sufficiently resilient characteristic to enable the membrane to vibrationally isolate an electronic device mounted thereon;

wherein the membrane is formed of a rubber having a durometer in the range from about 20 to about 90; a tensile strength between about 500 and 2000 psi; an elongation capability between about 200% and 1200% and a tear strength between about 50 and 300 PPI.

3. The vibration resistant mounting and oscillator as claimed in claim 1 wherein the membrane is peripherally gripped by the frame so as to form a trampoline like mounting for the electronic oscillator.

4. A vibration resistant mounting for an electronic device comprising:

a frame extending around an area;

a resilient flexible membrane sized to span the area and mounted to the frame so that the membrane is retained in a generally flat shape over the area, said membrane having a sufficiently resilient characteristic to enable the membrane to vibrationally isolate an electronic device mounted thereon;

wherein the membrane is peripherally gripped by the frame so as to form a trampoline like mounting for the electronic device and wherein the thickness of the membrane is in the range from about 0.016 inches to about 0.062 inches and the membrane is formed of solid silicone rubber.

5. A vibration resistant electronic oscillator comprising:

a frame;

a resilient flexible membrane mounted to the frame so that the membrane is retained in a generally flat shape, said membrane having a sufficiently resilient characteristic to enable the membrane to vibrationally isolate an electronic device mounted thereon; and an electronic oscillator mounted on the membrane and means for affixing the electronic oscillator to the membrane; and conductors extending from the oscillator through the frame to provide a vibrationally stable oscillator signal.

6. The vibration resistant electronic oscillator as claimed in claim 5 wherein said electronic oscillator is mounted generally centrally on the membrane and is surrounded by a peripheral segment of the membrane.

7. A vibration resistant electronic oscillator comprising:

a frame;

a resilient flexible membrane mounted to the frame so that the membrane is retained in a generally flat shape, said membrane having a sufficiently resilient characteristic to enable the membrane to vibrationally isolate an electronic device mounted thereon;

an electronic oscillator mounted on the membrane and means for affixing the electronic oscillator to the membrane; and wherein said affixing means comprises a tie wrap.

8. A vibration resistant electronic oscillator comprising:

a frame;

a resilient flexible membrane mounted to the frame so that the membrane is retained in a generally flat shape, said membrane having a sufficiently resilient characteristic to enable the membrane to vibrationally isolate an electronic device mounted thereon;

an electronic oscillator mounted on the membrane and means for affixing the electronic oscillator to the membrane; wherein said membrane is formed of a sheet material made of a polymer based rubber.

9. The vibration resistant electronic oscillator as claimed in claim 8 wherein the membrane is formed of a polymer rubber selected from the group consisting of silicone rubber, natural rubber, nitrile rubber, fluoro rubber, neoprene and butyl rubber.

10. A vibration resistant electronic oscillator comprising:

a frame;

a resilient flexible membrane mounted to the frame so that the membrane is retained in a generally flat shape, said membrane having a sufficiently resilient characteristic to enable the membrane to vibrationally isolate an electronic device mounted thereon; and an electronic oscillator mounted on the membrane; means for clamping the electronic oscillator to the membrane; and conductors extending from the oscillator through the frame to provide a vibrationally stable oscillator signal.

11. The vibration resistant electronic oscillator as claimed in claim 10 wherein the clamping means comprises a housing for retaining the electronic oscillator, said housing having a flange; and a plate complementary shaped with respect to said flange; said membrane having a generally centrally located opening sized to receive said housing so that said flange and said plate can clamp onto a membrane portion surrounding said opening.

12. The vibration resistant oscillator as claimed in claim 5 wherein said fastening means comprises an interlocking separable fastener having separable segments respectively affixed to said membrane and said electronic oscillator.

13. A vibration resistant electronic oscillator comprising:

a frame;

a resilient flexible membrane mounted to the frame so that the membrane is retained in a generally flat shape, said membrane having a sufficiently resilient characteristic to enable the membrane to vibrationally isolate an electronic device mounted thereon;

an electronic oscillator mounted on the membrane and means for affixing the electronic oscillator to the membrane;

wherein the membrane is formed of a rubber having a durometer in the range from about 20 to about 90; a tensile strength between about 500 and 2000 psi; an elongation capability between about 200% and 1200% and a tear strength between about 50 and 300 PPI.

14. The vibration resistant mounting as claimed in claim 13 wherein said membrane is formed of a sheet of silicone rubber.

15. A vibration resistant electronic oscillator comprising:

a frame;

a resilient flexible membrane mounted to the frame so that the membrane is retained in a generally flat shape, said membrane having a sufficiently resilient characteristic to enable the membrane to vibrationally isolate an electronic device mounted thereon;

an electronic oscillator mounted on the membrane and means for affixing the electronic oscillator to the membrane; wherein said membrane is formed of a sheet of rubber and has a thickness in the range from about 0.016 to about 0.062 inches.

16. A vibration resistant electronic oscillator comprising:

mounting means for supporting said electronic oscillator;

a resilient flexible membrane mounted to the mounting means so that the membrane is retained in a generally flat shape, said membrane having a sufficiently resilient characteristic to enable the membrane to vibrationally isolate an electronic device mounted thereon;

an electronic oscillator mounted on the membrane and means for affixing the electronic oscillator to the membrane; and conductors extending from the oscillator through said mounting means to provide a vibrationally stable oscillator signal.

17. The vibration resistant oscillator as claimed in claim 16 and further including a mass mounted to the membrane so as to enhance said vibration isolation by the membrane.

18. The vibration isolation oscillator as claimed in claim 17 wherein said means for mounting includes a frame surrounding an area; and wherein said membrane is mounted to said frame to span said area; and an enclosure sized to receive said frame and membrane and oscillator mounted thereto.

* * * * *